United States Patent [19]

Kondo et al.

[11] Patent Number: 5,028,884
[45] Date of Patent: Jul. 2, 1991

[54] LEAPFROG FILTER HAVING ADJUSTABLE CENTER FREQUENCY AND QUALITY FACTOR

[75] Inventors: Hiroshi Kondo; Tsuneo Tohyama; Takeyuki Kouti, all of Iruma, Japan

[73] Assignee: Toko, Inc., Tokyo, Japan

[21] Appl. No.: 527,575

[22] Filed: May 23, 1990

[30] Foreign Application Priority Data

May 24, 1989 [JP] Japan .................................. 1-130774

[51] Int. Cl.⁵ .............................................. H03F 1/34
[52] U.S. Cl. .................................. 330/305; 307/520; 330/306; 330/107
[58] Field of Search ............... 330/107, 109, 294, 305, 330/306; 307/520

[56] References Cited

U.S. PATENT DOCUMENTS 3,924,199  12/1975  Pearlman ........................... 330/107

Primary Examiner—James B. Mullins

[57] ABSTRACT

A leapfrog filter comprising a first and a second integrator each consisting of an operational amplifier and integrating capacitor. The leapfrog filter includes differential amplifier which is arranged to differentially supply current to the first and second integrators through a first and a second current source circuit respectively; and a third current source circuit for adjusting the sum of currents supplied to the first and second current source circuits, wherein characteristics such as the center frequency $f_o$ and quality factor Q of the leapfrog filter are controlled by adjusting the respective current values.

6 Claims, 6 Drawing Sheets

LEAPFROG FILTER HAVING ADJUSTABLE CENTER FREQUENCY AND QUALITY FACTOR

BACKGROUND OF THE INVENTION

1. Field of the Invention

This invention relates to a leapfrog filter, and more particularly it pertains to such a filter which is so designed that adjustment of the quality factor Q and center frequency $f_0$ of the filter characteristics is facilitated.

2. Description of the Prior Art

Referring to FIG. 1, description will first be made of an example of conventional active filter, which is constructed in the form of biquad circuit constituting a low-pass filter. The transfer function T(S) of a common low-pass filter is given as follows:

$$T(S) = \frac{\pm H \omega_0}{S^2 + (\omega_0/Q) s + \omega_0^2} \quad (1)$$

where $\omega_0$ is angular frequency; s is complex variable; Q is loss factor of coil; and H is gain factor.

The relationship between input and output voltages $V_1$ and $V_2$ of the biquad circuit can be expressed in the form of transfer function T(S) as follows:

$$\begin{aligned} T(S) &= V_2/V_1 \\ &= \frac{-1/R_3 R_4 C_1 C_2}{s^2 + (1/R_1 C_1) s + 1/R_2 R_4 C_1 C_2} \end{aligned} \quad (2)$$

Assuming that the factor of each term in Equation (1) and that in Equation (2) are equal to each other, the angular frequency $\omega_0$ and quality factor Q are given as follows:

$$\omega_0^2 = 1/R_3 R_4 C_1 C_2 \quad (3)$$

$$Q = (R_1^2 C_1/R_2 R_4 C_2)^{\frac{1}{2}} \quad (4)$$

As will be seen from Equations (3) and (4), it is required that circuit constants such as resistors $R_1$ to $R_4$ or capacitors $C_1$ and $C_2$ be made variable to make variable the center frequency $f_0$ and quality factor Q. With biquad circuit, to make variable the center frequency $f_0$ and quality factor Q, externally mounted components are used as the resistors $R_1$ to $R_4$ or capacitors $C_1$ and $C_2$, and the filter characteristic is adjusted by changing the circuit constants. With the conventional active filter such as biquad circuit, it has been the usual practice that a number of components such as operational amplifiers resistors, capacitors and so forth are hybrid-integrated on a hybrid substrate.

However, the conventional active filter such as shown in FIG. 1 is disadvantageous in that the manufacturing cost is high because a number of components are needed. Another disadvantage is such that when it is attempted to adjust the center frequency $f_0$ and quality factor Q of the filter, it is required that such adjustment be effected with components having different circuit constants being mounted on a printed circuit board in accordance with the desired filter characteristic.

SUMMARY OF THE INVENTION

Accordingly, it is a primary object of the present invention to provide a leapfrog filter which is so designed that the number of components is decreased.

Another object of the present invention is to provide a leapfrog filter which is so designed that adjustment of the center frequency and quality factor Q is facilitated.

The present invention has been made with a view to achieving the foregoing objects. According to the present invention, a leapfrog filter is constituted by a first and a second integrator comprising an operational amplifier and integrating capacitor; a differential amplifier is provided which differentially supplies a current to the first and second integrators through a first and a second current source circuit; and a third current source circuit is provided which is arranged to control the sum of currents supplied to the first and second current source circuits, thereby enabling the center frequency $f_0$ and quality factor Q of the filter characteristic to be adjusted through adjustment of the respective current values.

Other objects, features and advantages of the present invention will become apparent from the ensuing description taken in conjunction with the accompanying drawings.

DESCRIPTION OF THE PREFERRED EMBODIMENTS

Figure 1:
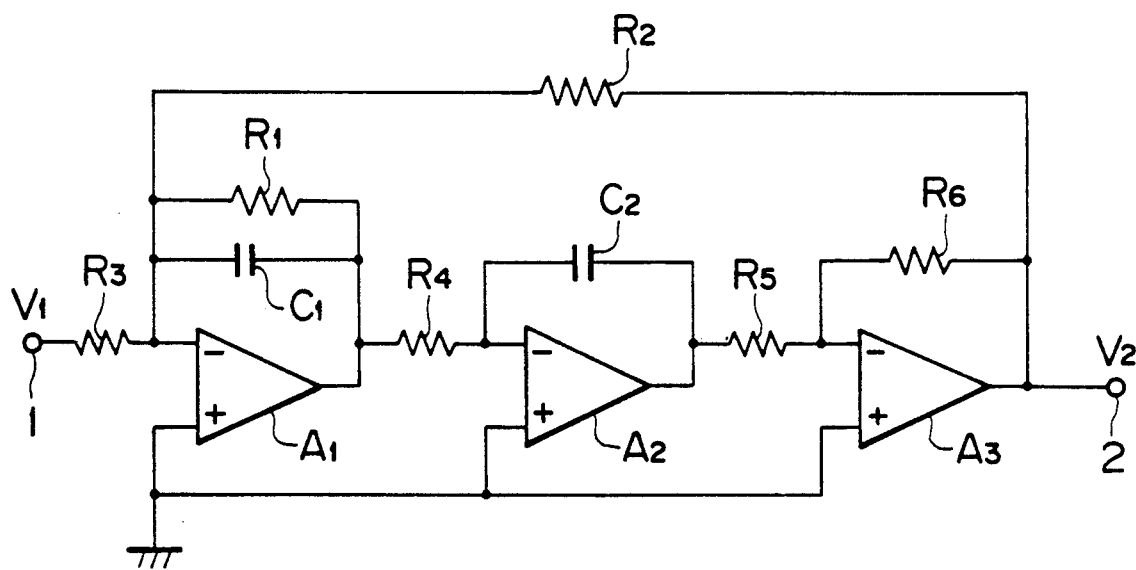
FIG. 1 is a circuit diagram showing an example of conventional biquad circuit.
Figure 2:
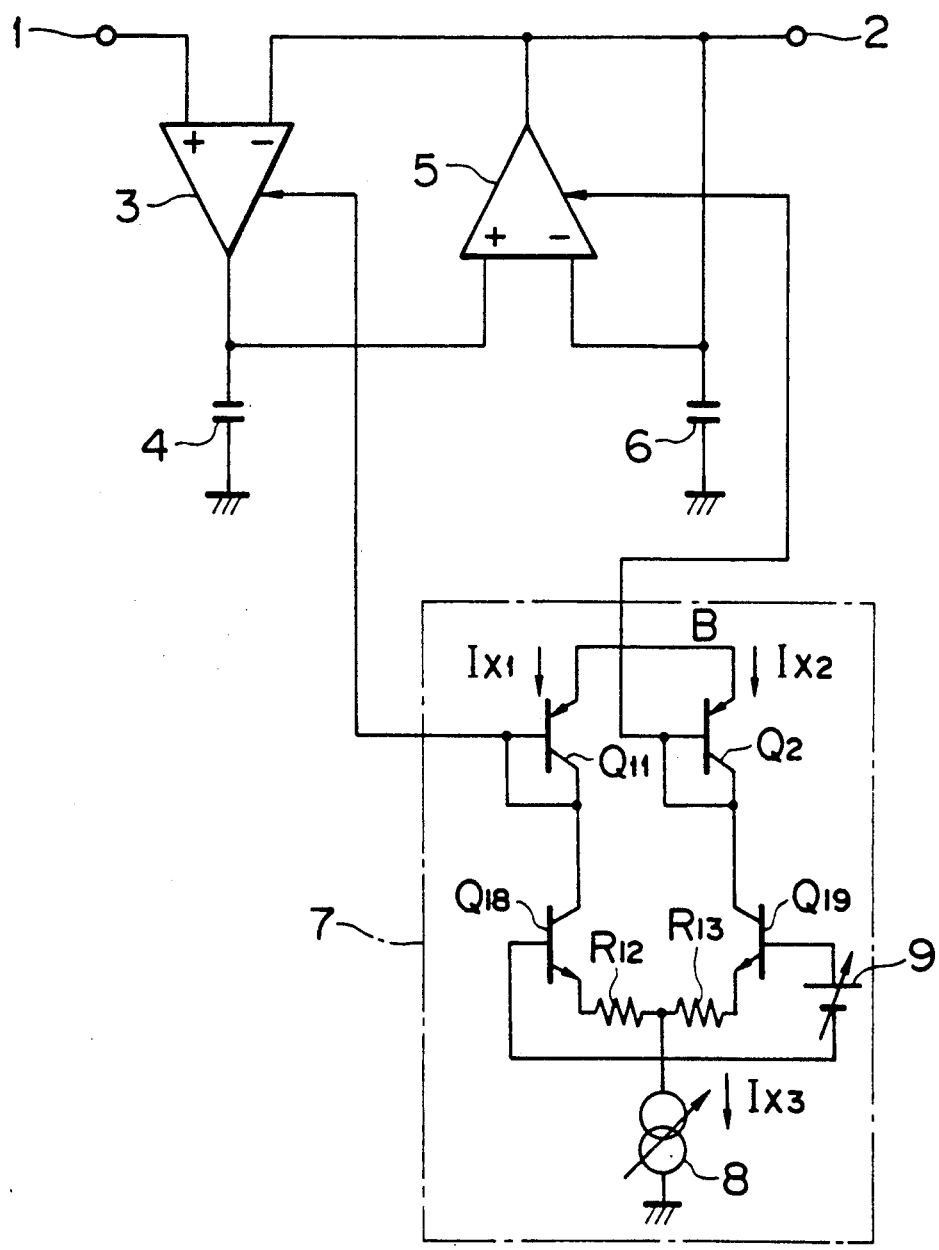
FIG. 2 is a circuit diagram showing the leapfrog filter according to an embodiment of the present invention.

Referring to FIG. 2, there is shown the leapfrog filter according to an embodiment of the present invention, which includes operational amplifiers 3 and 5, integrating capacitors 4 and 6, and a current source circuit 7 for adjusting the characteristic of the filter. Input terminal 1 is connected to non-inverting terminal of the operational amplifier 3 having the output terminal thereof connected to a capacitor 4 and also to non-inverting terminal of the operational amplifier 5. Inverting terminal of the operational amplifier 3 is coupled to the output terminal of the operational amplifier 5, one end of a capacitor 6, and output terminal 2. Each of the capacitors 4 and 6 is grounded at the other end. The operational amplifier 3, together with the capacitor 4 connected to its output terminal, constitutes an integrating circuit. Similarly, the operational amplifier 5, together with the capacitor 6 connected to its output terminal, constitutes an integrating circuit.

A current source circuit 7 is constituted by a differential amplifier for controlling a current supplied to the operational amplifiers 3 and 5, which comprises transistors $Q_{18}$ and $Q_{19}$ forming a differential pair; transistors $Q_{11}$ and $Q_2$ having their bases and collectors connected to the collectors of the transistors $Q_{18}$ and $Q_{19}$ respectively; resistors $R_{12}$ and $R_{13}$ connected to the emitters of the transistors $Q_{18}$ and $Q_{19}$ respectively; a variable current source circuit 8 to which the resistors $R_{12}$ and $R_{13}$ are connected in common; and a variable voltage source 9.

Figure 3:
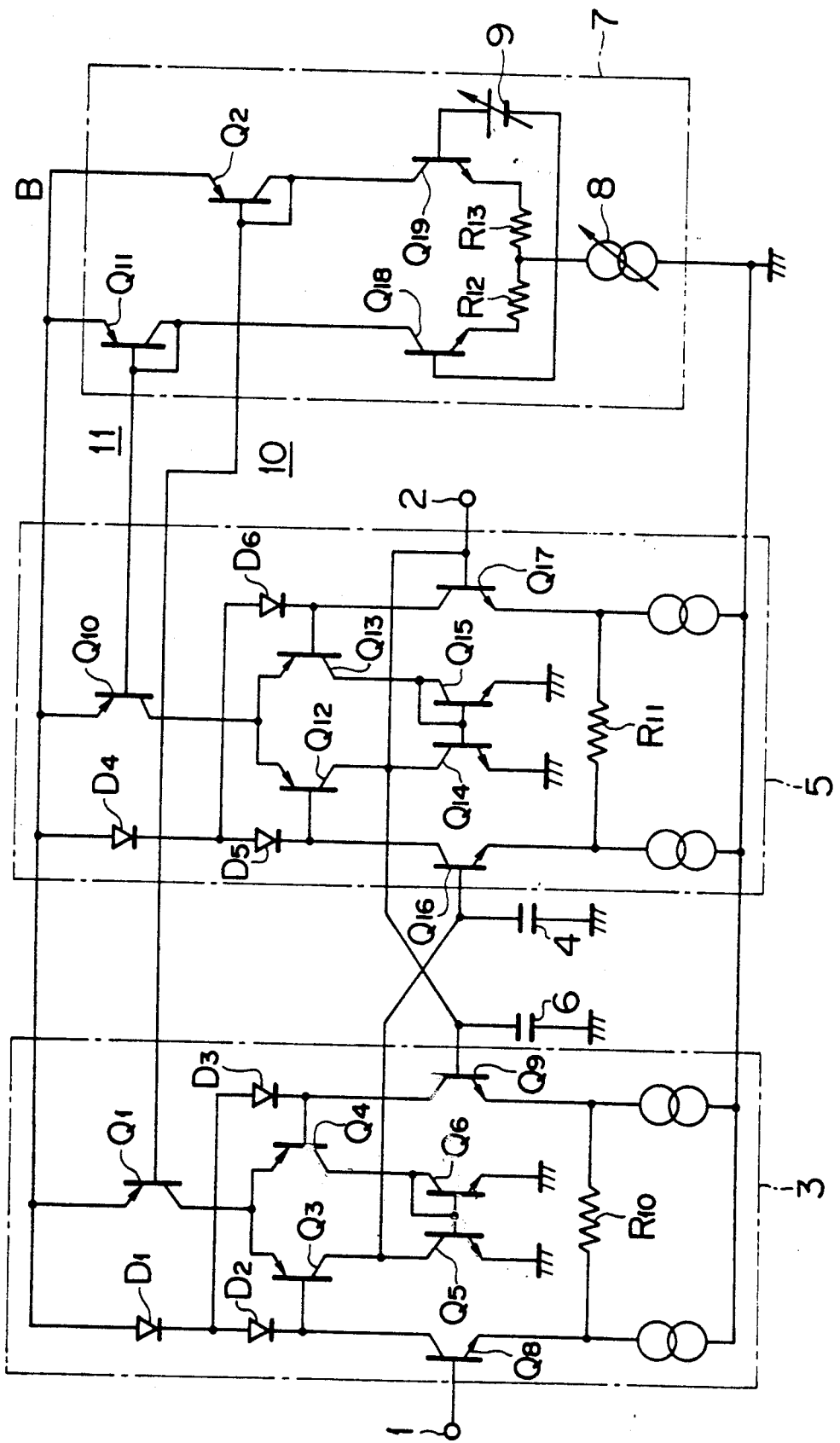
FIG. 3 is a circuit diagram showing a more practical version of the circuit arrangement shown in FIG. 2.

FIG. 3 shows a more practical version of the leapfrog filter shown in FIG. 2. In FIG. 3, the operational amplifier 3 comprises a differential pair of transistors $Q_3$ and $Q_4$ having their collectors connected to the collectors of transistors $Q_5$ and $Q_6$ which constitute current mirror circuit. Transistor $Q_1$ has its collector connected to the emitters, connected to each other, of the transistors $Q_3$ and $Q_4$, the emitter of the transistor $Q_1$ being connected to a power source voltage B. Diodes $D_2$ and $D_3$ have their cathodes connected to the bases of the transistors $Q_3$ and $Q_4$ respectively, the anodes of the diodes $D_2$ and $D_3$ being connected to each other and also to the cathode of a diode $D_1$ having its anode connected to the power source voltage B. The transistors $Q_3$ and $Q_4$ have their bases coupled to the collectors of transistors $Q_8$ and $Q_9$ respectively; a resistor $R_{10}$ is connected between the emitters of transistors $Q_8$ and $Q_9$; and each of the emitters of the transistors $Q_8$ and $Q_9$ is grounded through a current source. Capacitor 4 is coupled to the connected collectors of the transistors $Q_3$ and $Q_5$, and forms, together with the operational amplifier 3, an integrating circuit.

The operational amplifier 5 has a circuit arrangement similar to that of the operational amplifier 3 and comprises a differential pair of transistors $Q_{12}$ and $Q_{13}$; and transistors $Q_{14}$ and $Q_{15}$ having their collectors connected to those of the transistors $Q_{12}$ and $Q_{13}$, the transistors $Q_{14}$ and $Q_{15}$ constituting a current mirror circuit. The emitters, connected together, of the transistors $Q_{12}$ and $Q_{13}$ are connected to the collector of a transistor $Q_{10}$ having its emitter connected to the power source voltage B. Diodes $D_5$ and $D_6$ have their cathodes connected to the bases of the transistors $Q_{12}$ and $Q_{13}$ respectively, the anodes of the diodes $D_5$ and $D_6$ being connected together and also to the cathode of a diode $Q_4$ having its anode connected to the power source voltage B. A resistor $R_{11}$ is connected between the emitters of transistors $Q_{16}$ and $Q_{17}$. Each of the emitters of the transistors $Q_{16}$ and $Q_{17}$ is grounded through a current source. The transistor $Q_{16}$ has its base connected to the output terminal of the operational amplifier 3. The base of the transistor $Q_{17}$ is coupled to the collectors, connected together, of the transistors $Q_{12}$ and $Q_{14}$ and also to the output terminal 2. Capacitor 6 is coupled to the inter-connected collectors of the transistors $Q_{12}$ and $Q_{14}$, and forms, together with the operational amplifier 5, an intergrating circuit.

Transistors $Q_1$ and $Q_2$ have their bases connected together and thus constitutes a current mirror circuit 10. Transistors $Q_{10}$ and $Q_{11}$ also have their bases connected together and thus constitutes a current mirror circuit. Variable current source derived from the current source circuit 7 is supplied to the respective operational amplifiers 3 and 7. The current source circuit 7 comprises a transistor $Q_{11}$; a transistor $Q_{18}$ having its collector connected to the base and collector, connected together, of the transistor $Q_{11}$; a transistor $Q_2$; a transistor $Q_{19}$ having its collector connected to the base and collector, connected together, of the transistor $Q_{19}$; resistors $R_{12}$ and $R_{13}$ connected to the emitters of the transistors $Q_{18}$ and $Q_{19}$ respectively. Variable voltage source 9 is connected between the bases of the transistors $Q_{18}$ and $Q_{19}$.

Figure 4:
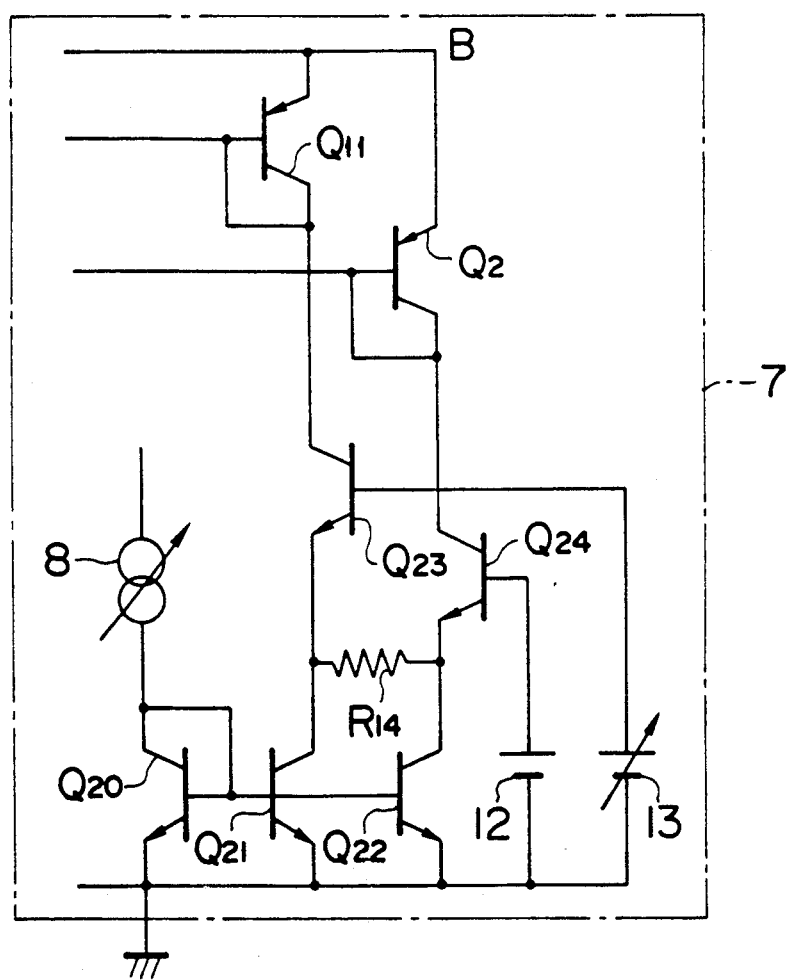
FIG. 4 is a circuit diagram showing another example of current source circuit.

The current source circuit 7 is not limited to the embodiment shown in FIG. 3 but can take such a form as shown in FIG. 4 wherein transistors $Q_{11}$ and $Q_2$ are diode connected with each other; transistors $Q_{23}$ and $Q_{24}$ have their collectors connected to the base of the transistor $Q_{11}$ and the collector of the transistor $Q_2$ respectively; resistor $R_{14}$ connected between the emitters of the transistors $Q_{23}$ and $Q_{24}$; and transistors $Q_{21}$ and $Q_{22}$ have their collectors connected across the resistor $R_{14}$. The transistors $Q_{21}$ and $Q_{22}$, together with a transistor $Q_{20}$ sharing the base with these transistors, constitute a current mirror circuit. A variable current source circuit 8 is connected to the base and collector of the transistor $Q_{20}$ which applies bias voltage to the transistors $Q_{21}$ and $Q_{22}$. Voltage sources 12 and 13 are coupled to the bases of the transistors $Q_{23}$ and $Q_{24}$ respectively. The voltage source 13 is adjustable.

Figure 5:
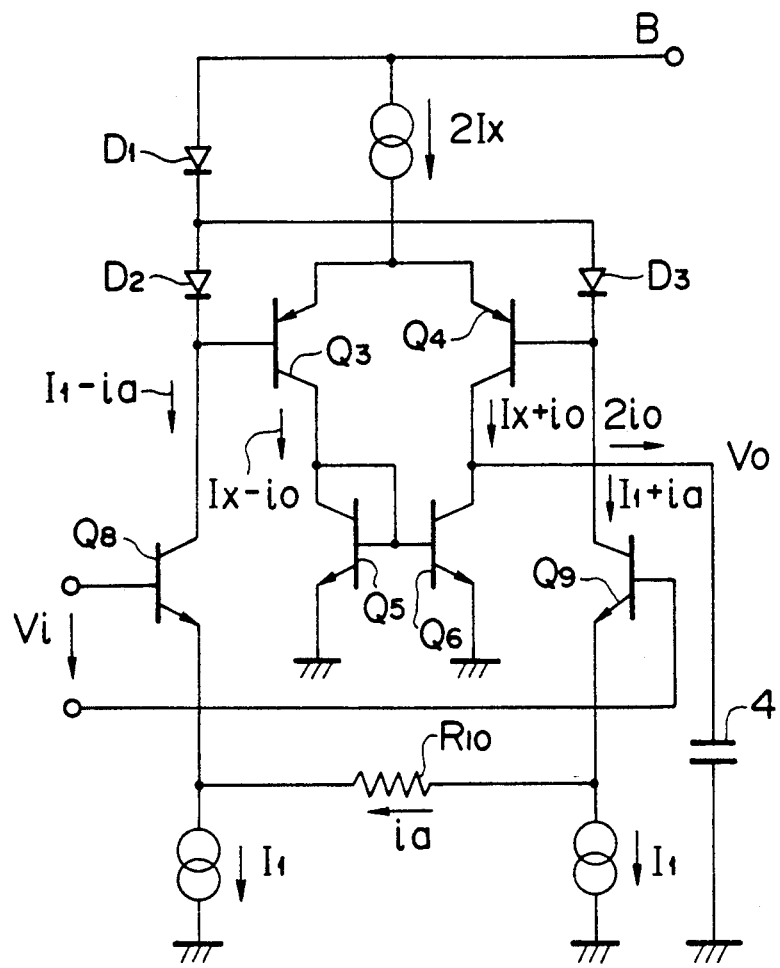
FIG. 5 is a circuit diagram useful for explaining the operation of the integrator.

Referring to FIG. 5, there is shown an example of integrating circuit which constitutes the leapfrog filter according to the present invention, and description will now be made of the operation of the integrating circuit, wherein $V_i$ indicates input voltage; $V_o$ represents output voltage; and $I_1$ and $I_x$ denote bias current. Let it be assumed that signal component current is $i_o$; that current flowing through the resistor $R_{10}$ is $i_a$; and that AC voltage $V_i$ applied to the bases of the transistors $Q_8$ and $Q_9$. Then, the following equation holds:

$$i_a = V_i/R_{10} \tag{5}$$

Also let it be assumed that the difference between the base voltages of the transistors $Q_3$ and $Q_4$ is $V_a$. The following relationship holds true:

$$\begin{aligned} V_a &= V_T \ln(I_1 + i_a)/I_{s1} - V_T \ln(I_1 - i_a)/I_{s1} \\ &= VT \ln(I_1 + i_a)/(I_1 - i_a) \end{aligned} \tag{6}$$

$$\begin{aligned} V_a &= V_T \ln(I_x + i_o)/I_{s2} - V_T \ln(I_x - i_o)/I_{s2} \\ &= V_T \ln(I_x + i_o)/(I_x - i_o) \end{aligned} \tag{7}$$

where $I_{s1}$ and $I_{s2}$ are saturation currents between the base and emitter of the transistors $Q_3$ and $Q_4$ which are equal to each other; and $V_T$ is thermal voltage.

The following equations are derived from Equations (6) and (7):

$$ln(I_1 + i_a)/(I_1 - I_a) = ln(I_1 + I_o)/(I_x - I_o)$$

$$(I_1 + i_a)/(I_1 - I_a) = (I_x + I_o)/(I_x - I_o)$$

By rearranging the above expressions and putting Equation (5) therein, the signal current $i_o$ is given as follows:

$$i_o = I_x i_a/I_1 = I_x \Delta V_i/I_1 R_{10} \tag{8}$$

Output voltage $V_o$ of the integrating circuit is given $$V_o = I_x V_i/I_1 R_{10} sC \tag{9}$$

Thus, the following equation is derived from Equation (9):

$$V_o/V_i = I_x/I_1 \cdot 1/R_{10} \cdot 1/sC \tag{10}$$

From Equation (9), mutual conductance gm may be expressed as follows:

$$gm = \partial i_o / \partial V_o = I_x / I_1 \cdot 1 / R_{10} \tag{11}$$

Then, the transfer function T(S) of the integrating circuit shown in FIG. 5 can be written as follows:

$$T(S) = V_o/V_i = gm/sC = 1/srC$$

where $r = 1/gm$.

It is apparent that the mutual conductance of the operational amplifier 3 is such that $r=1/gm$, and that the transfer function T(S) of the integrator depends on the function of bias current $I_1$, $I_x$ and resistance $R_{10}$. It will be seen that the integrating circuit changes the transfer function T(S) of the integrator by controlling the bias current $I_x$.

Description will now be made of the secondary leapfrog filter shown in FIG. 2 using the above-mentioned integrating circuit, by referring to the equivalent circuit of the secondary leapfrog filter shown in FIG. 6.

Figure 6:
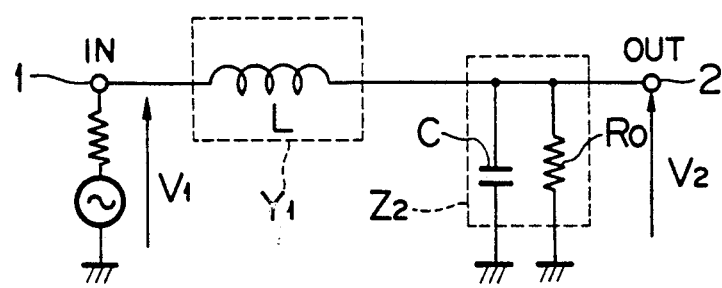
FIG. 6 is an equivalent circuit diagram of secondary low-pass filter.

Based on the equivalent circuit of FIG. 6, the following equations hold:

$$I_1 = Y_1(V_i - V_2) \tag{12}$$

$$V_2 = Z_2 \cdot I_1 \tag{13}$$

By using voltage quantities, these two equations can be rewritten as follows:

$$V I_1 = T_{y1}(V_i - V_2) \tag{14}$$

$$V_2 = T_{z2} \cdot V_{I1} \tag{15}$$

The following equations are also obtained:

$$T_{yi} = 1/s L$$

where
s = jω

$$T_{z2} = 1/(1 + s C)$$

Figure 7:
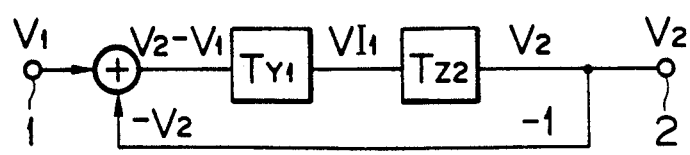
FIG. 7 is a feedback of the secondary low-pass filter.

From such expressions, it is possible to depict the signal diagram, shown in FIG. 7.

The admittance Y1 of coil L shown in the equivalent circuit diagram of FIG. 6 is given as follows:

$$A(s) = \frac{1}{sL \cdot 1/gm} \tag{16}$$

Since $gm = 1/r$, Equation (16) can be rewritten as follows:

$$A(s) = 1/s L r$$

By letting $r = 1$, Equation (16) is rewritten as follows:

$$A(s) = 1/s L \tag{17}$$

The impedance $Z_2$ of the equivalent circuit of FIG. 6 is expressed in terms of transfer function B(s) as follows:

$$B(s) = \frac{gm/s C}{1 + gm/s C} = \frac{1}{1 + s C/gm} \tag{18}$$
$$= 1/(1 + s C r)$$

By letting $r = 1$, Equation (18) is rewritten as follows:

$$B(s) = 1/(1 + s C)$$

Thus, the total transfer function T (s) of the leapfrog filter is given as follows:

$$\begin{aligned} T(s) &= V_2/V_1 \\ &= T_{yi} T_{z2}/(1 + T_{y1} T_{z2}) \\ &= A(s) B(s)/(1 + A(s) B(s)) \end{aligned} \tag{19}$$

A(s) and B(s) can be rewritten as follows:

$$A(s) = 1/s L, [1/s L r] \tag{20}$$

$$\begin{aligned} B(s) &= 1/(1 + s C) \\ &= 1/(1 + s C r) \end{aligned} \tag{21}$$

The transfer functions A(s) and B(s) can also be rewritten as follows:

$$A(s) = 1/s L = Q \omega_o / s \tag{22}$$

By letting $1/s C = \omega_o/s Q$, the transfer function B(s) of $Z_2$ is written as below.

$$\begin{aligned} B(s) &= 1/(1 + s C) \\ &= (\omega_o/s Q)/(1 + \omega_o/s Q) \\ &= (\omega_o/Q)/(s + \omega_o/Q) \end{aligned} \tag{23}$$

Thus, by putting Equations (22) and (23) in Equation (19), it is possible to express the total transfer function T(s) as follows:

$$\begin{aligned} T(s) &= A(s) \cdot B(s)/(1 + A(s) \cdot B(s)) \\ &= \omega_o^2/(s^2 + \omega_o/Q s + \omega_o^2) \end{aligned} \tag{24}$$

Description will next be made of the variable current source circuit 7 of the leapfrog filter shown in FIG. 2. Let it be assumed that r ($r = 1/gm$) of the operational amplifiers 3 and 5 constituting the integrators is $r_1$ and $r_2$ respectively, and that the capacitance of the capacitors 4 and 6 is $C_1$ and $C_2$ respectively. The transfer function of each integrator is then expressed as follows:

$$Q \omega_o/s = 1/s r_1 C_1$$

$$\omega_o/s Q = 1/s r_2 C_2$$

Further, by rearranging the above equations, the following expressions can be obtained:

$$Q \omega_o = 1 /s r_1 C_1 \tag{25}$$

$$\omega_o/Q = 1/r_2 C_2 \tag{26}$$

Still further, the following expressions hold true:

$$1/r_1 = gm_1 = I_{x1}/I_1 \cdot R_{10}$$

$$1/r_2 = gm_2 = I_{x2}/I_2 \cdot R_{10}$$

By rearranging the above expressions, it is possible to obtain the following equations:

$$r_1 = I_1 \cdot R_{10}/I_{x1} \quad (27)$$

$$r_2 = I_1 \cdot R_{10}/I_{x2} \quad (28)$$

Thus, the quality factor Q can be sought from Equations (25) ad (26) as mentioned below. By putting Equations (27) and (28) in the expression thus sought, the following equations are obtained:

$$\begin{aligned} Q\,\omega_o/(\omega_o/Q) &= Q^2 \\ &= r_2\,C_2/r_1\,C_1 \\ &= (C_2\,I_2\,R_{10}/I_{x2})/(C_1\,I_1\,R_{10}/I_{x2}) \end{aligned}$$

Consequently, the quality factor Q can be written as follows:

$$Q = (C_2\,I_{x1}/C_1\,I_{x2})^{\frac{1}{2}} \quad (29)$$

The center frequency $\omega_o$ is sought from Equations (27) and (28). By putting Equations (27) and (28) in the resultant expression, the following expression is obtained:

$$\begin{aligned} Q\,\omega_0 \cdot \omega_0/Q &= \omega_0^2 = 1/r_1\,C_1\,r_2\,C_2 \\ &= I_{x1}\,I_{x2}/C_1\,C_2\,I_1^2\,R_{10}^2 \end{aligned}$$

Consequently, the center frequency $\omega_o$ is expressed as follows:

$$\omega_o = 1/I_1\,R_{10} \cdot (I_{x1}\,I_{x2}/C_1\,C_2)^{\frac{1}{2}} \quad (30)$$

Let it now be assumed that $I_{x1} + I_{x2} = I_a$ and $C_2/C_1 = C_k$ are constant and that $1/I_1\,R_{10}\,(C_1\,C_2)^{\frac{1}{2}}$ is constant. Then the quality factor Q can be written as follows:

$$\begin{aligned} Q &= [C_K \cdot (I_a - I_{x2})/I_{x2}]^{\frac{1}{2}} \quad (31) \\ &= C_K^{\frac{1}{2}} \cdot (I_a/I_{x2} - 1)^{\frac{1}{2}} \end{aligned}$$

$$\omega_o = C_j \cdot [I_{x2}\,(I_a - I_{x2})]^{\frac{1}{2}} \quad (32)$$

Figure 8:
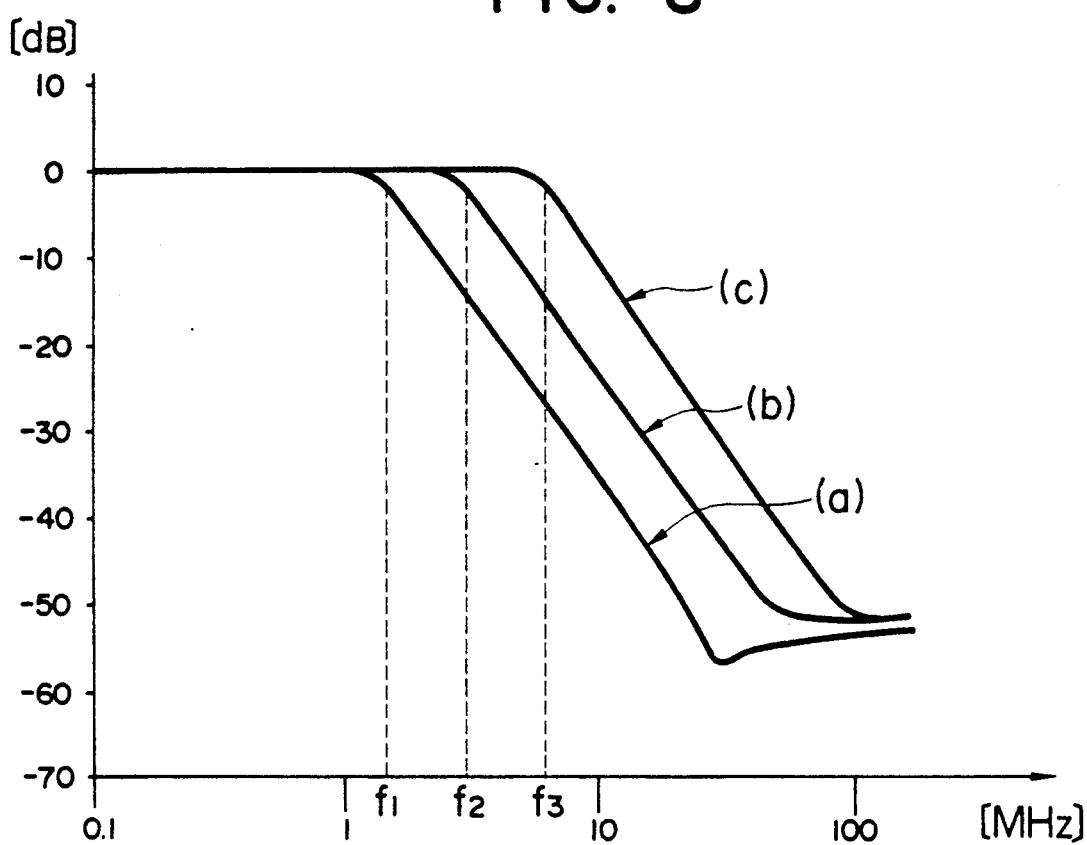
FIG. 8 illustrates the characteristic of center frequency $f_0$ of the filter according to the present invention.
Figure 9:
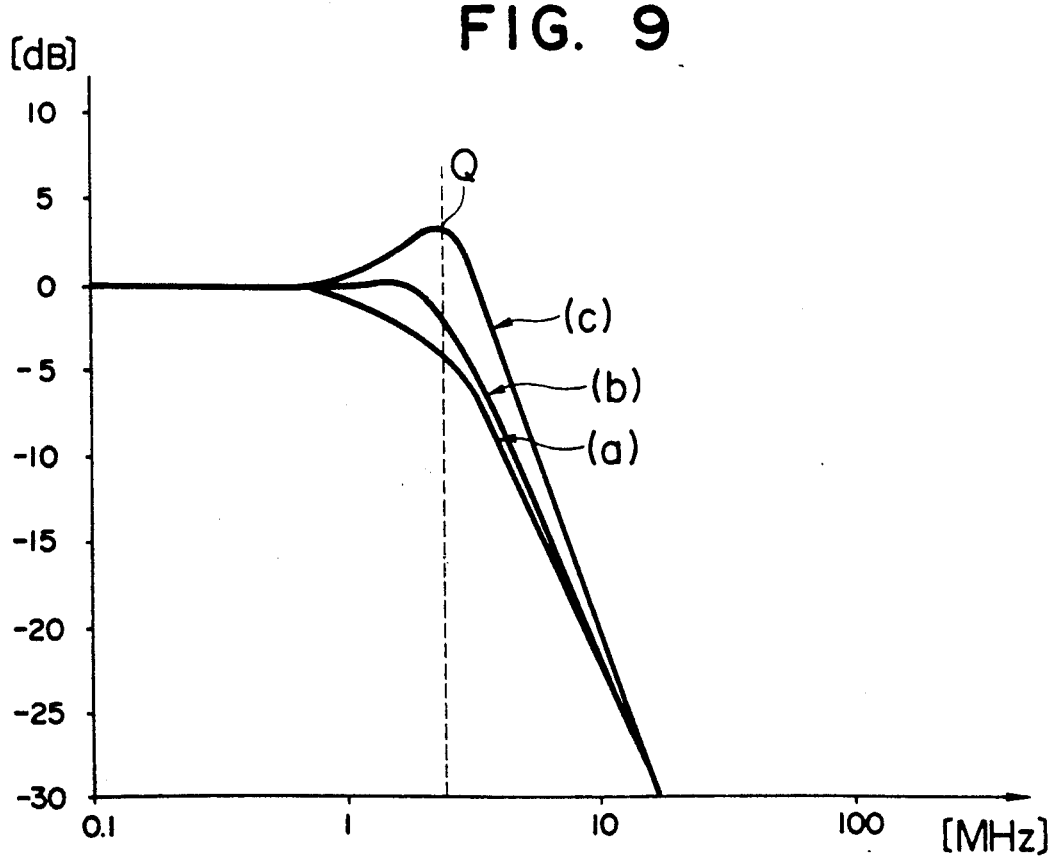
FIG. 9 illustrates the characteristic of quality factor Q of the leapfrog filter embodying the present invention.

FIGS. 8 and 9 illustrate the characteristics of the leapfrog filter according to the present invention with respect to the case where bias currents $I_{x1}$ and $I_{x2}$ for the operational amplifiers 3 and 5 are varied with $I_{x1} = I_{x2} = 0.5 I_a$ and with respect to the case where bias current $I_{x3}$, the sum of the bias currents $I_{x1}$ and $I_{x2}$, is changed, respectively. FIG. 8 shows the characteristic of the center frequency $f_o$, and FIG. 9 indicates the characteristic of the quality factor Q. More specifically, in FIG. 8, (a), (b) and (c) represent characteristics when the bias current $I_{x3}$ of the variable current source circuit 8 is changed with the variable voltage source 9 being fixed, from which it will be seen that as the bias current $I_{x3}$ increases, the center frequency $f_o$ becomes higher as indicated by $f_1$, $f_2$ and $f_3$. FIG. 9 illustrates how the quality factor Q is changed when the bias currents $I_{x1}$ and $I_{x2}$ are varied by changing the voltage of the variable voltage source 9 with the bias current $I_{x3}$ being fixed, from which it will be noted that as the voltage of the variable voltage source 9 is increased, the quality factor Q is adjusted as indicated at (a), (b) and (c) in FIG. 9.

As will be appreciated from the above discussion, according to the present invention, the center frequency $f_o$ and quality factor Q of the low-pass filter can easily be adjusted by controlling the bias current ($I_{x1} + I_{x2} = I_{x3}$) which is being supplied to the integrator.

While in the above-described embodiment, description has been made with respect to secondary low-pass filter, it will be apparent to those skilled in the art that even with N-th order low-pass filter, similar effects can be produced by controlling bias current for an integrator interposed between the input stage and the output stage.

As will be appreciated from the foregoing explanation, with the leapfrog filter according to the present invention, by controlling the current source circuits for the first and second integrators constituting the leapfrog filter, the mutual conductances of the the operational amplifiers constituting the integrators at the input and output stages are differentially changed so that the quality factor Q is controlled, while the center frequency $f_o$ is controlled by changing current consumption in the operational amplifiers.

The leapfrog filter according to the present invention comprises an active filter which is well suited for fabrication in the form of an integrated semiconductor circuit. With the leapfrog filter of this invention, the number of externally mounted components is decreased as compared with the conventional ones, and the center frequency $f_o$ and quality factor Q of the filter characteristic can readily be adjusted simply controlling the bias current for the integrators constituting the leapfrog filter.

Furthermore, the leapfrog filter according to the present invention can be provided as an inexpensive and miniaturized active filter since the same is fabricated in the form of integrated semiconductor circuit and the number of externally mounted components is decreased as mentioned above.

While the present invention has been illustrated and described with respect to specific embodiments thereof, it is to be understood that the present invention is by no means limited thereto but covers all changes and modifications which will become possible within the scope of the appended claims.

We claim:

1. A leapfrog filter comprising a first and a second integrating circuit each consisting of an operational amplifier and integrating capacitor, said leapfrog filter including a differential pair of transistors; a first and a second current source circuit connected to the collectors of said differential pair of transistors respectively; and a third current source circuit for adjusting the sum of currents supplied to said first and second current source circuits, wherein filter characteristic is adjusted by changing current values of said first to third current source circuits.

2. A leapfrog filter according to claim 1, further including first means for making constant the ratio of current values supplied to said first and second integrating circuits through said first and second current source circuits and controlling the current value of said third current source circuit; and second means for making constant the current value supplied to said third current source circuit and controlling the currents supplied to said first and second integrating circuit and base voltages of the transistors constituting said differential transistor pair, thereby adjusting quality factor Q of said filter.

3. A leapfrog filter comprising a first and a second integrating circuit each consisting of an operational amplifier and integrating capacitors, said leapfrog filter including a first and a second current source circuit, each consisting of a mirror circuit, for suppling current to said first and second integrating circuits; a differential amplifier for differentially supplying a current to said first and second current source circuits; and a third current source circuit for adjusting the sum of currents supplied to said first and second current source circuits, wherein filter characteristic is adjusted by changing the respective current values.

4. A leapfrog filter comprising a first and a second integrating circuit each consisting of an operational amplifier and integrating capacitor, said leapfrog filter including a first and a second current source circuit, each consisting of a current mirror circuit, for supplying current to said first and second integrating circuits respectively; a differential pair of transistors for differentially supplying current to first and second said integrating circuits through said first and second current source circuits respectively; a third current source circuit for adjusting the sum of currents supplied to said first and second current source circuits; first adjusting means for making constant the ratio of the currents supplied to said first and second integrating circuits through said first and second current source circuits respectively and for controlling center frequency $f_o$ of the filter by changing the current of said third current source circuit; and second adjusting means for making constant the current value of said third current source circuit and for adjusting current supplied from said first and second current source circuits to said first and second integrating circuits respectively, thereby controlling quality factor of the filter.

5. A leapfrog filter comprising a first and a second integrating circuit each consisting of an operational amplifier and integrating capacitor, said leapfrog filter including a first and a second current source circuits, each consisting of a current mirror circuit, for suppling current to said first and second integrating circuits respectively; a differential pair of transistors for differentially supplying current to said first and second integrating circuits through said first and second current source circuits respectively; and a third current source circuit for adjusting the sum of currents supplied to said first and second current source circuits, wherein quality factor of the filter is controlled by making constant the value of current derived from said third current source circuit and adjusting base voltages of the transistors constituting said differential transistor pair.

6. A leapfrog filter comprising a first and a second integrating circuit each consisting of an operational amplifier and integrating circuit, said leapfrog filter including a first and a second current source circuit, each consisting of a current mirror circuit, for supplying current to said first and second integrating circuits; a differential transistor pair constituted by a first and a second transistor each having collector, base and emitter, said collectors being connected to said first and second current source circuits respectively, said bases being connected to a voltage source, said emitters being coupled to opposite ends of a resistor, respectively, a third current source circuit comprising a third and a fourth transistor connected to the emitters of said first and second transistors respectively, a fifth transistor having base and collector and emitter, said fifth transistor being diode-connected and having the base thereof being configured in common with those of said third and fourth transistors, and a variable current source circuit connected to the base and collector of said fifth transistor; and adjusting means for adjusting, by changing said voltage source, current supplied from said first and second current source circuits to said first and second integrating circuits, wherein filter characteristic is adjusted by changing the current of said third current source circuit.

* * * * *